United States Patent
Han et al.

(10) Patent No.: US 9,972,382 B2
(45) Date of Patent: May 15, 2018

(54) NON-VOLATILE MEMORY DEVICE

(71) Applicant: THE-AIO CO., LTD., Gyeonggi-do (KR)

(72) Inventors: Seung-Hyun Han, Seoul (KR); Sun-Mo Hwang, Gyeonggi-do (KR)

(73) Assignee: The-AiO Inc., Gyeonggi-do (KR)

( * ) Notice: Subject to any disclaimer, the term of this patent is extended or adjusted under 35 U.S.C. 154(b) by 76 days.

(21) Appl. No.: 15/029,217

(22) PCT Filed: Oct. 6, 2014

(86) PCT No.: PCT/KR2014/009360
§ 371 (c)(1),
(2) Date: Apr. 13, 2016

(87) PCT Pub. No.: WO2015/056915
PCT Pub. Date: Apr. 23, 2015

(65) Prior Publication Data
US 2016/0300609 A1    Oct. 13, 2016

(30) Foreign Application Priority Data
Oct. 14, 2013    (KR) .................. 10-2013-0122133

(51) Int. Cl.
*G06F 11/00*    (2006.01)
*G11C 11/56*    (2006.01)
(Continued)

(52) U.S. Cl.
CPC ...... *G11C 11/5642* (2013.01); *G06F 11/1044* (2013.01); *G06F 11/1048* (2013.01);
(Continued)

(58) Field of Classification Search
CPC ............. G06F 11/1044; G06F 11/1048; G06F 11/1068; G06F 11/1016
See application file for complete search history.

(56) References Cited

U.S. PATENT DOCUMENTS

2012/0155186 A1* 6/2012 Chokan .............. G11C 16/3459
                                                    365/185.22
2013/0058164 A1* 3/2013 Moschiano ......... G11C 11/5628
                                                    365/185.09
(Continued)

FOREIGN PATENT DOCUMENTS

KR    10-2009-000463 A    1/2009
KR    10-2009-0000466 A    1/2009
(Continued)

*Primary Examiner* — Charles Ehne
(74) *Attorney, Agent, or Firm* — Blank Rome LLP

(57) ABSTRACT

A non-volatile memory device according to example embodiments includes at least one NAND flash memory and a memory controller configured to control the NAND flash memory. The memory controller comprises a bit counter configured to count a number of first binary digit of each of first to N-th readout page data, the first to N-th readout page data being respectively read by first to N-th test read voltages, a register configured to store first to N-th count values with respect to the first to N-th readout page data output from the bit counter, and a read voltage adjuster configured to compare the first to N-th count values to determine a read voltage, where N is an integer greater than 1.

9 Claims, 5 Drawing Sheets

(51) Int. Cl.
  *G06F 11/10* (2006.01)
  *G11C 16/26* (2006.01)
  *G11C 16/34* (2006.01)
  *G11C 29/02* (2006.01)
(52) U.S. Cl.
  CPC ...... *G06F 11/1068* (2013.01); *G11C 11/5628* (2013.01); *G11C 16/26* (2013.01); *G11C 16/3404* (2013.01); *G11C 29/021* (2013.01); *G11C 29/028* (2013.01)

(56) References Cited

U.S. PATENT DOCUMENTS

2013/0336057 A1* 12/2013 Chung .................. G11C 16/10
　　　　　　　　　　　　　　　　　　　365/185.03
2014/0119124 A1* 5/2014 Kim .................... G11C 11/5642
　　　　　　　　　　　　　　　　　　　365/185.18

FOREIGN PATENT DOCUMENTS

| KR | 10-2011-0116473 A | 10/2011 |
| KR | 10-2013-0008302 A | 1/2013 |

\* cited by examiner

NON-VOLATILE MEMORY DEVICE

BACKGROUND

1. Technical Field

Example embodiments of the inventive concept relate to semiconductor memory devices. More particularly, example embodiments of the inventive concept relate to non-volatile memory devices having multi level cells.

2. Discussion of Related Art

A semiconductor memory device may be classified into tow types (i.e., a volatile memory device and a non-volatile memory device) according to whether data can be retained when power is not supplied. Recently, a NAND flash memory device having multi level cells (Hereinafter, a MLC NAND flash memory device) is widely used as the non-volatile memory device because the NAND flash memory device can be manufactured smaller in size while having higher capacity.

The NAND flash memory device performs a write operation and a read operation by a page unit. A read margin of a threshold voltage state distribution is not sufficiently secured when the MLC NAND flash memory performs the read operation of page data, on that read errors occur. Further, the read errors may gradually increase due to the threshold voltage state distribution becomes broader with the passage of time.

For this reason, the MLC NAND flash memory device has employed a technique for adjusting a read voltage (or a readout voltage) in order to reduce the read errors and to improve the reliability of the page data that are read out by the read voltage. However, when the MLC flash memory device is employed the technique for adjusting the read voltage, the operations for adjusting the read voltage have to be separately performed in addition to the basic operations (e.g., the read operation, the write operations, an erase operation, etc). Therefore, the typical MLC NAND flash memory device is difficult to operate at a high speed.

SUMMARY

Example embodiments provide a non-volatile memory device determining an optimal read voltage to reduce read errors.

According to example embodiments, a display device may comprise at least one NAND flash memory and a memory controller configured to control the NAND flash memory. The memory controller may comprise a bit counter configured to count a number of first binary digit of each of first to N-th readout page data, the first to N-th readout page data being respectively read by first to N-th test read voltages, a register configured to store first to N-th count values with respect to the first to N-th readout page data output from the bit counter, and a read voltage adjuster configured to compare the first to N-th count values to determine a read voltage, where N is an integer greater than 1

In example embodiments, the first binary digit may correspond to a binary digit '1', and a second binary digit of each of the first to N-th page data may correspond to a binary digit '0'.

In example embodiments, the first binary digit may correspond to a binary digit '0', and a second binary digit of each of the first to N-th page data may correspond to a binary digit '1'.

In example embodiments, the bit counter may be implemented in hardware. The bit counter may count the number of the first binary digit of the each of the first to N-th readout page data when the first to N-th readout page data are transmitted from the NAND flash memory to the memory controller.

In example embodiments, the first to N-th test read voltages may respectively correspond to first to N-th reference voltages dividing a predetermined margin between a first threshold voltage state and a second threshold voltage state into first to (N−1)-th voltage ranges. The second threshold voltage state may be adjacent to the first threshold voltage state.

In example embodiments, the first reference voltage may correspond to a predetermined upper limit value of the first threshold voltage state and the N-th reference voltage corresponds to a predetermined lower limit value of the second threshold voltage state.

In example embodiments, the read voltage adjuster may calculate a plurality of delta values, and select a voltage range having a minimum value among the delta values as a read voltage range. Each of the delta values may be a difference between adjacent count values among the first to N-th count values.

In example embodiments, the read voltage adjuster may determine a median value of the read voltage range as the read voltage.

In example embodiments, the read voltage adjuster may determine a lower limit value or an upper limit value of the read voltage range as the read voltage.

In example embodiments, the memory controller may further comprise an error correction code (ECC) engine configured to perform an error correction operation to the each of the first to N-th readout page data.

Therefore, the non-volatile memory device according to example embodiments may determine the read voltage for reducing (or minimizing) error bits of the readout page data by using the bit counter implemented in hardware such that the work processing speed and the reliability of the operation of the non-volatile memory device may be improved.

BRIEF DESCRIPTION OF THE DRAWINGS

Illustrative, non-limiting example embodiments will be more clearly understood from the following detailed description taken in conjunction with the accompanying drawings.

DETAILED DESCRIPTION OF EMBODIMENTS

Exemplary embodiments will be described more fully hereinafter with reference to the accompanying drawings, in which various embodiments are shown.

Figure 1:
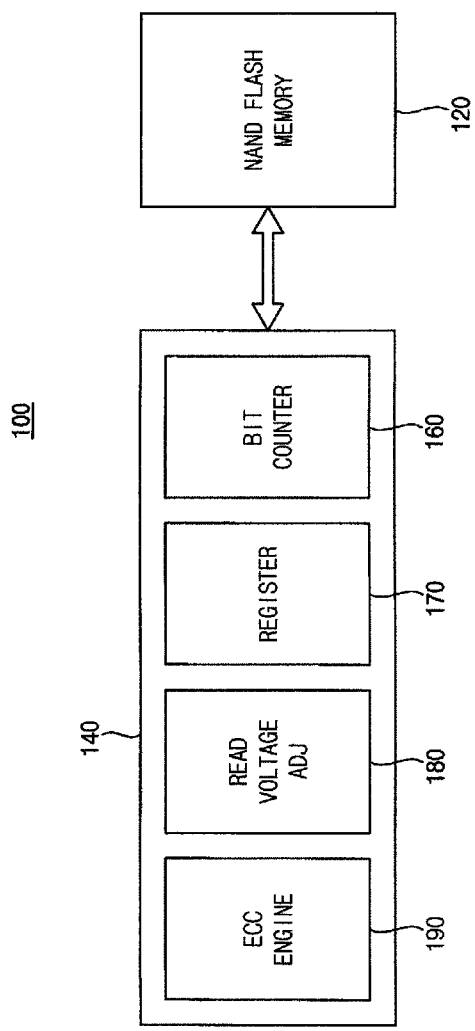
FIG. 1 is a block diagram of a non-volatile memory device according to example embodiments.

FIG. 1 is a block diagram of a non-volatile memory device according to example embodiments.

Referring to FIG. 1, the non-volatile memory device 100 may include a NAND flash memory 120 and a memory controller 140. It should be understood that the non-volatile memory device 100 includes at least one NAND flash memory 120.

The NAND flash memory 120 may perform a read operation and a write operation to data (hereinafter, page data) by a page unit, and the NAND flash memory performs an erase operation by a block unit. The NAND flash memory 120 may include a memory cell array having a plurality of single level cells (SLCs) or a plurality of multi level cells (MLCs), and a page buffer. The NAND flash memory 120 may interact with the memory controller 140 based on a NAND interface protocol.

The memory controller 140 may receive write data from a host based on a write command signal and output the write data to the NAND flash memory 120. The memory controller 140 may receive read data from the NAND flash memory 120 based on a read command signal and output the read data to the host. The memory controller 140 may interact with the host based on at least one of various protocols such as an Universal Serial Bus (USB) protocol, a multimedia card (MMC) protocol, a peripheral component interconnection (PCI) protocol, a PCI-express (PCI-E) protocol, an Advanced Technology Attachment (ATA) protocol, a Serial-ATA (S-ATA) protocol, a Parallel-ATA (P-ATA) protocol, a small computer small interface (SCSI) protocol, an enhanced small disk interface (ESDI) protocol, and an Integrated Drive Electronics (IDE) protocol. In one embodiment, the memory controller 140 may include a bit counter 160, a register 170, a read voltage adjuster 180, and an error correction code (ECC) engine 190 to determine a read voltage for minimizing (or reducing) error bits of the NAND flash memory 120 and to perform an error correction. However, it is not limited that the register 170 and the read voltage adjuster 180 are included in the memory controller 140. For example, the read voltage adjuster 180 may be included in the NAND flash memory 120 and implemented in algorithms or hardware.

The bit counter 160 may count the number of binary digit of each of readout page data. Each of the readout page data may be read (or generated) by a test read voltage. Specifically, the bit counter 160 may count the number of binary digits of each of first to N-th readout page data, where N is an positive integer. Each of the first to N-th readout page data may be read by first to N-th test read voltages, respectively. In one embodiment, the first binary digit of each of the first to N-th readout page data may correspond to a binary digit '1', and a second binary digit of each of the first to N-th readout page data may correspond to a binary digit '0'. For example, when a specific readout page data read by a specific test voltage is '10010100', the bit counter 160 may count the number of the first binary digit (i.e., may count the number of '1') and return '3'. In one embodiment, the first binary digit of each of the first to N-th readout page data corresponds to a binary digit '0', and the second binary digit of each of the first to N-th readout page data corresponds to a binary digit '1'. For example, when a specific readout page data read by a specific test voltage is '10010100', the bit counter 160 may count the number of the first binary digit (i.e., may count the number of '0') and return '6'.

The bit counter 160 may be implemented in hardware. The bit counter 160 may count the number of the first binary digit of each of the first to N-th readout page data when the first to N-th readout page data are transmitted from the NAND flash memory 120 to the memory controller 140. Thus, time loss caused by bit count operation process in a typical software algorithm may be eliminated (or reduced) such that a memory cell counting operation may be performed at a high speed. Meanwhile, methods for counting the number of the first binary digit may be variously designed by hardware.

In one embodiment, the first to N-th test read voltages may respectively correspond to first to N-th reference voltages. The first to N-th reference voltages may divide a predetermined margin between a first threshold voltage state and a second threshold voltage state into first to (N−1)-th voltage ranges. The second threshold voltage state may be adjacent to the first threshold voltage state. Thus, each page may receive N of test read voltages within the margin. Each of the test read voltages may have predetermined interval. First to N-th count values with respect to the first to N-th readout page data output from the bit counter 160 may be stored in the register 170. However, it is not limited that the register 170 is included in the memory controller 140. For example, the register 170 may be included in the NAND flash memory 120.

The read voltage adjuster 180 may compare the first to N-th count values to determine a read voltage. In one embodiment, the read voltage adjuster 180 may calculate a plurality of delta values. Each of the delta values may be a difference between adjacent count values among the first to N-th count values. The read voltage adjuster 180 may select a voltage range having a minimum value among the delta values as a read voltage range. Here, the first to N-th count values may correspond to the counted values by the bit counter 160 which are stored in the register 170. The delta value may be an absolute value of the difference between the adjacent count values (e.g., the absolute value of the difference between a third count value and a fourth count value). The minimum value (i.e., a minimum delta value) means that the minimum number of memory cells is included the read voltage range having the minimum value. That is, a read voltage for minimizing the error bits of the readout page data may be in the read voltage range having the minimum value. Accordingly, the read voltage adjuster 180 may determine a new read voltage within the read voltage range.

In one embodiment, the read voltage adjuster 180 may determine a median value of the read voltage range as the read voltage. In one embodiment, the read voltage adjuster 180 may determine a lower limit value of the read voltage range as the read voltage. In one embodiment, the read voltage adjuster 180 may determine an upper limit value of the read voltage range as the read voltage. Thus, the non-volatile memory device 100 may generate the new read voltage (i.e., the read voltage determined by the read voltage adjuster 180) to read (or readout) the page data having the minimized (or reduced) error bits. However, these are examples, and methods for determining (or adjusting) the read voltages are not limited thereto.

In one embodiment, the memory controller 140 may further include the ECC engine to perform the error correction operation to the page data. For example, the memory controller 140 may include a bit correction unit configured to correct bits of the readout page data read from the NAND flash memory 120 to generate bit corrected page data during the read operation, and an ECC unit configured to perform an ECC encoding to the write data received from the host by a page unit to generate the page data during the write operation and to perform an ECC decoding to the bit corrected page data to generate error corrected page data during the read operation. Here, the bit correction unit and the ECC unit in the ECC engine 190 may be implemented in hardware or soft ware. In addition, the ECC may be a low density parity check (LDPC) code, a Bose Chaudhuri Hocquenghem (BCH) code, a hamming code, etc. However, the ECC is not limited thereto.

As described above, the non-volatile memory device 100 may count the number of first binary digit included in the readout page data that are read by the test read voltages when the data (or the readout page data) are transmitted from the NAND flash memory 120 to the memory controller 140. That is, the bit counting operation and the readout page data transferring operation may be substantially simultaneously performed. Thus, the time loss caused by bit count operation process may be reduced (or eliminated) and a speed for determining the read voltage may be improved in comparison with the typical methods for verifying a memory cell distribution with respect to the test read voltages using software programs (or algorithms). In addition, a logical structure for determining the new read voltage by calculating the delta values and finding the minimum value among the delta values may be a very simple logical structure, such that the processing speed for determining the read voltage may be improved and the optimal read voltage can be determined at each word line or page.

Figure 2:
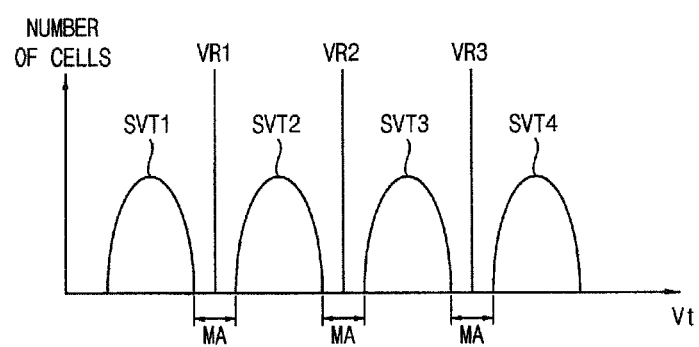
FIG. 2 is a diagram illustrating an example of an ideal threshold voltage state distribution of memory cells in a NAND flash memory of the non-volatile memory device of FIG. 1.

FIG. 2 is a diagram illustrating an example of an ideal threshold voltage state distribution of memory cells in a NAND flash memory of the non-volatile memory device of FIG. 1.

Referring to FIG. 2, a threshold voltage of a memory cell in which 2-bit data is programmed may be any one of four threshold voltage states SVT1, SVT2, SVT3, and SVT4. In ideal case, the four threshold voltage states SVT1, SVT2, SVT3, and SVT4 may be set having intervals for providing sufficient read margins MA between the adjacent threshold voltages. Each of the four threshold voltage states SVT1, SVT2, SVT3, and SVT4 may occupy a predetermined voltage range. The number of threshold voltage states SVT1, SVT2, SVT3, and SVT4 may increase when the number of stored bits increases. A threshold voltage window where the threshold voltage of the memory cell is distributed has to be sufficiently secured to provide sufficient read margins MA. Thus, the MLC NAND flash memory device is implemented by a method for reducing voltage ranges of each of the read margins MA and voltage ranges of each of the threshold voltage states SVT1, SVT2, SVT3, and SVT4 within the limited threshold voltage window. The read errors caused by the decrease of the voltage ranges of the read margins MA and the voltage ranges of the threshold voltage states SVT1, SVT2, SVT3, and SVT4 may be corrected by the bit correction of the page data or the ECC.

In the MLC NAND flash memory device, each of the memory cells in which 2-bit data are programmed may indicate four states according to a threshold voltage of the memory cell. Each of the states may correspond to a predetermined value. For example, the memory cell of the MLC NAND flash memory device may indicate one of "11", "10", "00", and "01" according to a voltage level of the threshold voltage. An N-th read voltage may be a voltage for reading the data according to the voltage level of the threshold voltage of the memory cell. In the MLC NAND flash memory device, a first read voltage VR1, a second read voltage VR2, and a third read voltage VR3 may be set in increasing order of the voltage level of the threshold voltage to separate the four states SVT1, SVT2, SVT3, and SVT4.

Figure 3:
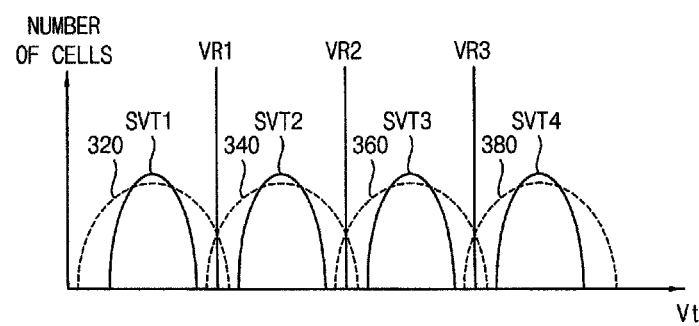
FIG. 3 is a diagram illustrating an example of a broaden threshold voltage distribution of a memory cell in the NAND flash memory of the non-volatile memory device of FIG. 1.

FIG. 3 is a diagram illustrating an example of a broaden threshold voltage state distribution of memory cells in a NAND flash memory of the non-volatile memory device of FIG. 1.

Referring to FIG. 3, threshold voltage states of the memory cells may change (or broaden) in abnormal states (e.g., 320, 340, 360, and 380 in FIG. 3) due to a coupling or charge leakage in a programming operation (e.g., a data write operation). The threshold voltage of the memory cells may also broaden according to normal program operations. For example, a relatively high level program voltage is applied to a page line of the memory cell when the programming operation is performed, so that a range of the threshold voltage of the memory cell may be extended to a higher level. Further, electron charge injected into a floating gate of the memory cell may be leaked such that the range of the threshold voltage of the memory cell may be extended to a lower level. Thus, relatively large amount of read errors may occur when data stored in the memory cell is read by the predetermined read voltages. Some bits of error bits can be corrected by ECC error detection bits. Further, the read voltages may be adjusted such that the read errors (and the error bits) may be much reduced. The read voltages may be set as a first read voltage VR1, a second read voltage VR2, and a third read voltage VR3 where the minimum numbers of memory cells exist. The first to third read voltages VR1 to VR3 may be set by analyzing a plurality of test read voltages such that the read errors can be reduces (or be eliminated). Thus, the non-volatile memory device 100 may set the read voltages for minimum read error at high speed and minimize a burden of error correction operation, so that work processing speed and reliability of the operation of the non-volatile memory device 100 may be improved. Hereinafter, methods for determining (or adjusting) the read voltage in the non-volatile memory device 100 will be described with reference to FIGS. 4 and 5.

Figure 4:
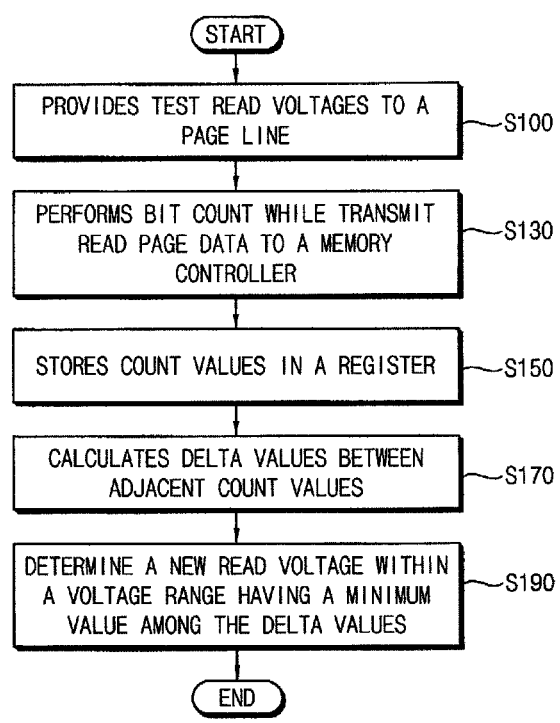
FIG. 4 is a flowchart illustrating an example of a method for determining a read voltage in the non-volatile memory device of FIG. 1.
Figure 5:
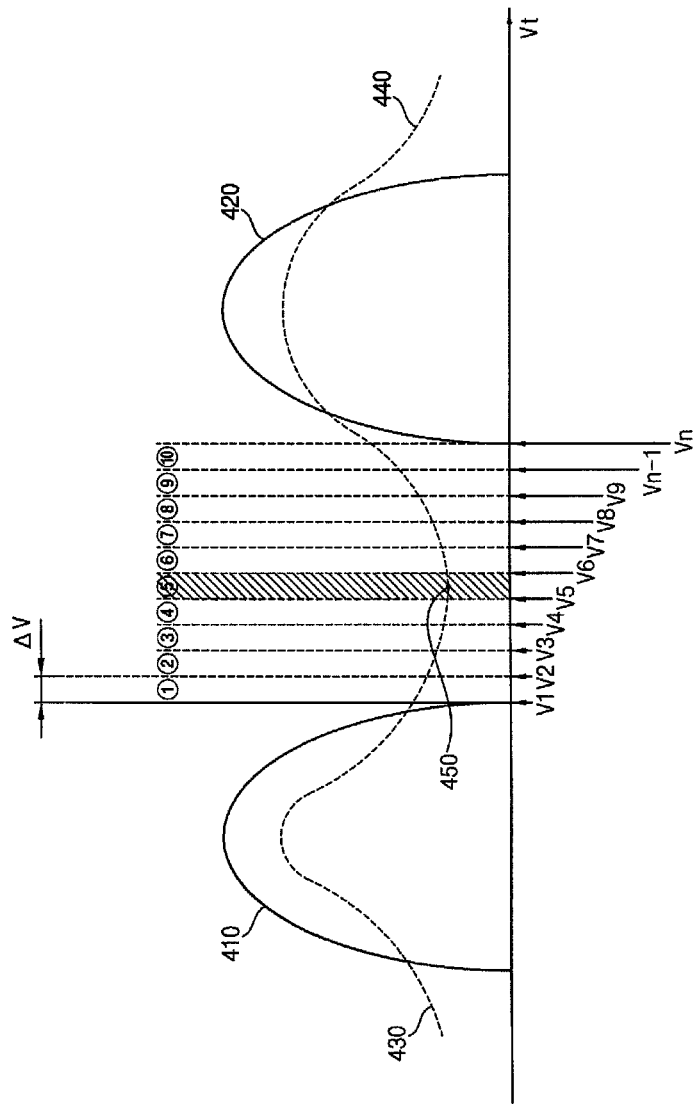
FIG. 5 is a diagram illustrating an example of which the non-volatile memory device of FIG. 1 determines a read voltage.

FIG. 4 is a flowchart illustrating an example of a method for determining a read voltage in the non-volatile memory device of FIG. 1, and FIG. 5 is a diagram illustrating an example of which the non-volatile memory device of FIG. 1 determines a read voltage.

Referring to FIGS. 4 and 5, the method for determining an optimal read voltage may include providing a plurality of test read voltages to a page line S110, performing bit count operation (i.e., counting a first binary digits) by hardware-wise while readout page data are transmitted to the memory controller S130, storing count values calculated by the bit count operation in the register S150, calculating delta values each being a difference between adjacent count values among the count values S170, and determining a new read voltage within a voltage range having a minimum value among the delta values S190. Thus, the non-volatile memory device 100 may operate at high speed compared with typical read voltage setting methods implemented in software. Since each of the steps S110, S130, S150, S170, and S190 are described above referred to FIG. 1, duplicated descriptions will not be repeated. Accordingly, the threshold voltage distribution of the memory cells may be analyzed using the hardware not the data operation algorithm such that the work processing speed and the reliability of the operation of the non-volatile memory device 100 may be improved.

As illustrated in FIG. 5, first and second threshold voltage states 410 and 420 that are initially specified in a specification of the NAND flash memory 120 may be changed (or altered) into a first altered threshold voltage state 430 and a second altered threshold voltage state 440 due to coupling or charge leakage of a floating gate. Accordingly, some parts of the first and second altered threshold voltage states 430 and 440 may overlap each other such that first and second altered threshold voltage states 430 and 440 may have a minimum point 450 at which a distribution of memory cells (or the number of memory cells) are the minimum. Thus, the read error may be minimized (or reduced) when a voltage corresponding to the minimum point 450 is determined to be the read voltage, so that the burden of correction bits by the ECC engine 190 may be reduced.

In one embodiment, first to N-th test read voltages V1 to Vn may correspond to predetermined first to N-th reference voltages V1 to Vn, respectively. The first to N-th reference voltages V1 to Vn may divide a predetermined margin up into first to (N−1)-th voltage ranges (e.g., ① to ⑩ in FIG. 5). A range of the margin may correspond to a voltage range from V1 to Vn. The first to N-th test read voltages V1 to Vn may be output from a register having a voltage control command, a high voltage generator controlled by control logics, etc. However, these are examples, and methods for applying the first to N-th test read voltage are not limited thereto.

In one embodiment, a single margin may have a range from the first reference voltage V1 corresponding to a predetermined upper limit voltage of the first threshold voltage state 410 to the N-th reference voltage Vn corresponding to a predetermined lower limit of the second threshold voltage state 420. Accordingly, the first reference voltage V1 may correspond to the first test read voltage V1 and the N-th reference voltage Vn may correspond to the N-th test read voltage Vn.

The first to N-th test read voltages V1 to Vn are applied to the page line and then the readout page data may be transmitted to the memory controller 140 to perform the error correction, etc. The typical methods counts the number of memory cells corresponding to the respective first to N-th test read voltages V1 to Vn using programmed algorithms and finds a portion having the minimum number of memory cells to optimize the read voltage. The typical methods have unnecessary and inefficient arithmetic operations for determining the read voltage. Thus, the inefficient arithmetic operations are factors in speed down and deterioration problems of the non-volatile memory device having the MLC NAND flash memory. To solve these problems, the memory controller 140 may include the bit counter 160 configured to count the number of the first binary digits of first to N-th readout page data. The first to N-th readout page data may be read (or be output) from the first to N-th test read voltages V1 to Vn.

In one embodiment, the bit counter 160 may be implemented in hardware. The bit counter 160 may count the number of the first binary digit of the each of the first to N-th readout page data when the first to N-th readout page data are transmitted from the NAND flash memory 120 to the memory controller 140. Thus, the non-volatile memory device 100 may operate at high speed compared with typical read voltage setting methods implemented in software. First to N-th count values may correspond to the numbers of the first binary digits of first to N-th readout page data, respectively. The first to N-th count values may be stored in the register 170.

For example, when the readout page data at the first test read voltage V1 is '10001000' and the readout page data at the second test read voltage V2 is '10101010', the bit counter 160 in which a binary digit '1' is set as the first binary digit may return the first count value corresponding to the first test read voltage V1 as '2' and second count value corresponding to the second test read voltage V2 as '4'. The first and second count values may be stored in the register 170. Similarly, the bit counter 160 may repeatedly calculate third to N-th count values and store in the register 170. In one embodiment, the first binary digit of each of the first to N-th readout page data may correspond to a binary digit '0', and the second binary digit of each of the first to N-th readout page data may correspond to a binary digit '1'. Here, the bit counter 160 may count the number of the binary digits '0'.

In one embodiment, the read voltage adjuster 180 may calculate a plurality of delta values. One of the delta values may be a difference a K-th count value and a (K−1)-th count value, where K is an integer greater than 1 and less than or equal to N. The read voltage adjuster 180 may select a voltage range having a minimum value among the delta values as a read voltage range. As illustrated in FIG. 5, first to (N−1)-th voltage ranges ① to ⑩ may be set based on the first to N-th test read voltages V1 to Vn V1 to Vn. Widths ΔV of the first to (N−1)-th voltage ranges ① to ⑩ may be substantially the same or not. The number of the first to (N−1)-th voltage ranges ① to ⑩ is not limited thereto.

For example, when the first count value corresponding to the first test read voltage V1 is '2' and the second count value corresponding to the second test read voltage V2 is '4', the number of memory cells included in the first voltage range ① may be 2 bits as a first delta value that is the difference between the first count value and the second count value (i.e., 4−2=2). Similarly, the delta values of the second to (N−1)-th voltage ranges ② to ⑩ may be calculated.

The read voltage adjuster 180 may select one of the first to (N−1)-th voltage ranges ① to ⑩ having the minimum value among the delta values as the read voltage range. The read voltage range may correspond to a voltage range in which the minimum number of memory cells. For example, as illustrated in FIG. 5, a fifth voltage range ⑤ may be the read voltage range. The read voltage adjuster 180 may determine (or select) a specific voltage within the read voltage range (i.e., the fifth voltage range ⑤ in FIG. 5) as a new read voltage. In one embodiment, the read voltage adjuster 180 may determine a median value of the read voltage range as the read voltage. For example, the new read voltage may equal to a voltage '(V5+V6)/2'. In one embodiment, the read voltage adjuster 180 may determine a lower limit value of the read voltage range as the read voltage. For example, the fifth test read voltage V5 corresponds to the lower limit value of the read voltage range (i.e., the fifth voltage range ⑤ in FIG. 5) such that the fifth test read voltage V5 may be selected as the read voltage. In one embodiment, the read voltage adjuster 180 may determine an upper limit value of the read voltage range as the read voltage. For example, a sixth test read voltage V6 corresponds to the upper limit value of the read voltage range (i.e., the fifth voltage range ⑤ in FIG. 5) such that the sixth test read voltage V6 may be selected as the read voltage.

Figure 6:
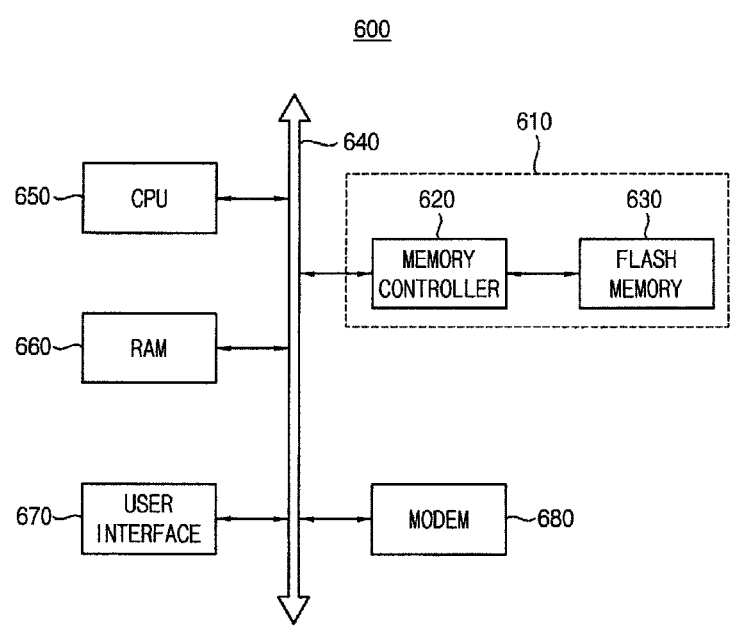
FIG. 6 is a block diagram illustrating an example of a computing system including the non-volatile memory device of FIG. 1.

FIG. 6 is a block diagram illustrating an example of a computing system including the non-volatile memory device of FIG. 1.

Referring to FIG. 6, the non-volatile memory device 610 according to example embodiments may be included in the computing system 500 (e.g., a mobile device, a computer, etc). The computing system 500 may include the non-volatile memory device 610 having a memory controller 620 and a NAND flash memory 630, a central processing unit (CPU) 650, a random access memory (RAM) 660, a user interface 670, and a modem 680. Data processed at the CPU 650 and/or provided through the user interface 670 may be stored in the non-volatile memory device 610 by the memory controller 620. The CPU 650 corresponding to a host of the non-volatile memory device 610 and other components may receive data having high reliability from the non-volatile memory device 610.

As described above, the bit counting operation and the readout page data transfer may be substantially simultaneously performed. Thus, the time loss caused by bit count operation process may be reduced (or eliminated) and a speed for determining the read voltage may be improved in comparison with the typical methods for verifying a memory cell distribution in test read voltage periods using software programs (or algorithms). In addition, a logical structure for determining the new read voltage by calculating the delta values and finding the minimum value among the delta values may be a very simple logical structure, such that the processing speed for determining the read voltage may be improved and the optimal read voltage can be determined at each word line or page.

The present embodiments may be applied to any non-volatile memory device and any computing system including the same. For example, the present inventive concept may be applied to a Solid State Drive (SSD), a Secure Digital Card (SDCARD), a Universal Flash Storage (UFS), an Embedded Multi Media Card (EMMC), a Compact Flash (CF) card, a memory stick, an eXtreme Digital (XD) picture card, etc. Further, the present embodiments may be applied to a television, a computer monitor, a laptop, a digital camera, a cellular phone, a smart phone, a smart pad, a personal digital assistant (PDA), a portable multimedia player (PMP), a MP3 player, a navigation system, a game console, a video phone, etc.

The foregoing is illustrative of example embodiments, and is not to be construed as limiting thereof. Although a few example embodiments have been described, those skilled in the art will readily appreciate that many modifications are possible in the example embodiments without materially departing from the novel teachings and advantages of example embodiments. Accordingly, all such modifications are intended to be included within the scope of example embodiments as defined in the claims. In the claims, means-plus-function clauses are intended to cover the structures described herein as performing the recited function and not only structural equivalents but also equivalent structures. Therefore, it is to be understood that the foregoing is illustrative of example embodiments and is not to be construed as limited to the specific embodiments disclosed, and that modifications to the disclosed example embodiments, as well as other example embodiments, are intended to be included within the scope of the appended claims. The inventive concept is defined by the following claims, with equivalents of the claims to be included therein.

| DESCRIPTIONS OF REFERENCE CHARACTERS | |
| --- | --- |
| 100: non-volatile memory device | 120: NAND flash memory |
| 140: memory controller | 160: bit counter |
| 170: register | 180: read voltage adjuster |

What is claimed is:

1. A non-volatile memory device, comprising:
at least one NAND flash memory; and
a memory controller configured to control the NAND flash memory,
wherein the memory controller comprises:
a bit counter configured to count a number of first binary digit of each of first to N-th readout page data, the first to N-th readout page data being respectively read by first to N-th test read voltages;
a register configured to store first to N-th count values with respect to the first to N-th readout page data output from the bit counter; and
a read voltage adjuster configured to compare the first to N-th count values to determine a read voltage,
wherein N is an integer greater than 1,
wherein the bit counter is implemented in hardware, and
wherein the bit counter is configured to count the number of the first binary digit of the each of the first to N-th readout page data when the first to N-th readout page data are transmitted from the NAND flash memory to the memory controller.

2. The non-volatile memory device of claim 1, wherein the first binary digit corresponds to a binary digit '1', and a second binary digit of each of the first to N-th page data corresponds to a binary digit '0'.

3. The non-volatile memory device of claim 1, wherein the first binary digit corresponds to a binary digit '0', and a second binary digit of each of the first to N-th page data corresponds to a binary digit '1'.

4. The non-volatile memory device of claim 1, wherein the first to N-th test read voltages respectively correspond to first to N-th reference voltages dividing a predetermined margin between a first threshold voltage state and a second threshold voltage state into first to (N−1)-th voltage ranges, the second threshold voltage state being adjacent to the first threshold voltage state.

5. The non-volatile memory device of claim 4, wherein the first reference voltage corresponds to a predetermined upper limit value of the first threshold voltage state and the N-th reference voltage corresponds to a predetermined lower limit value of the second threshold voltage state.

6. The non-volatile memory device of claim 1, wherein the read voltage adjuster is configured to calculate a plurality of delta values each being a difference between adjacent count values among the first to N-th count values, and to select a voltage range having a minimum value among the delta values as a read voltage range.

7. The non-volatile memory device of claim 6, wherein the read voltage adjuster is configured to determine a median value of the read voltage range as the read voltage.

8. The non-volatile memory device of claim 6, wherein the read voltage adjuster is configured to determine a lower limit value or an upper limit value of the read voltage range as the read voltage.

9. The non-volatile memory device of claim 1, wherein the memory controller further comprises: an error correction code (ECC) engine configured to perform an error correction operation to the each of the first to N-th readout page data.

* * * * *